United States Patent [19]
Gardner et al.

[11] Patent Number: 5,801,075
[45] Date of Patent: *Sep. 1, 1998

[54] METHOD OF FORMING TRENCH TRANSISTOR WITH METAL SPACERS

[75] Inventors: Mark I. Gardner, Cedar Creek; Robert Dawson, Austin; H. Jim Fulford, Jr., Austin; Frederick N. Hause, Austin; Mark W. Michael, Cedar Park; Bradley T. Moore; Derick J. Wristers, both of Austin, all of Tex.

[73] Assignee: Advanced Micro Devices, Inc., Sunnyvale, Calif.

[*] Notice: This patent issued on a continued prosecution application filed under 37 CFR 1.53(d), and is subject to the twenty year patent term provisions of 35 U.S.C. 154(a)(2).

[21] Appl. No.: 739,593

[22] Filed: Oct. 30, 1996

[51] Int. Cl.$^6$ .................................................. H01L 21/8238
[52] U.S. Cl. .......................... 438/197; 438/221; 438/230
[58] Field of Search ................................. 437/29, 40, 41, 437/44, 34, 43; 438/197, 230, 242, 243, 244, 221, 261

[56] References Cited

U.S. PATENT DOCUMENTS

| | | | |
|---|---|---|---|
| 4,713,356 | 12/1987 | Hiruta | 437/41 |
| 4,745,086 | 5/1988 | Parrillo et al. | 436/29 |
| 4,830,975 | 5/1989 | Bovaird et al. | 437/41 |
| 4,962,060 | 10/1990 | Sliwa et al. | 437/192 |
| 4,963,502 | 10/1990 | Teng et al. | 437/41 |
| 5,094,973 | 3/1992 | Pang | 437/67 |
| 5,141,891 | 8/1992 | Arima et al. | 437/44 |
| 5,166,084 | 11/1992 | Pfiester | 437/29 |
| 5,175,118 | 12/1992 | Yoneda | 437/44 |
| 5,182,222 | 1/1993 | Malhi et al. | 437/41 |
| 5,217,913 | 6/1993 | Watabe et al. | 437/44 |
| 5,231,038 | 7/1993 | Yamaguchi et al. | 437/44 |
| 5,331,116 | 7/1994 | Haslam et al. | 174/250 |

(List continued on next page.)

FOREIGN PATENT DOCUMENTS

| | | |
|---|---|---|
| 64-4058 | 1/1989 | Japan . |
| 2-22868 | 1/1990 | Japan . |
| 4-92436 | 3/1992 | Japan . |

OTHER PUBLICATIONS

U.S. Application Serial No. 08/703,272, filed Aug. 16, 1996, entitled "Insulated-Gate Field-Effect Transistor With Metal Spacers", by Gardner et al.

*Primary Examiner*—Brian Dutton
*Assistant Examiner*—Michael S. Lebentritt
*Attorney, Agent, or Firm*—Skjerven, Morrill, MacPherson, Franklin & Friel LLP; David M. Sigmond

[57] ABSTRACT

An IGFET with a gate electrode and metal spacers in a trench is disclosed. The IGFET includes a trench with opposing sidewalls and a bottom surface in a semiconductor substrate, metal spacers adjacent to the sidewalls and the bottom surface, a gate insulator on the bottom surface between the metal spacers, protective insulators on the metal spacers, a gate electrode on the gate insulator and protective insulators, and a source and drain adjacent to the bottom surface. A method of forming the IGFET includes implanting a doped layer into the substrate, etching completely through the doped layer and partially through the substrate to form the trench and split the doped layer into source and drain regions, applying a high-temperature anneal to diffuse the source and drain regions beneath the bottom surface, depositing a blanket layer of conductive metal over the substrate and applying an anisotropic etch to form the metal spacers, depositing a continuous insulative layer over the substrate to provide the gate insulator and the protective insulators, depositing a blanket layer of gate electrode material over the substrate, and polishing the gate electrode material so that the gate electrode is substantially aligned with a top surface of the substrate. Advantageously, the channel length is significantly smaller than the trench length, and the metal spacers reduce the parasitic resistance of lightly doped source and drain regions.

50 Claims, 11 Drawing Sheets

U.S. PATENT DOCUMENTS

| | | | |
|---|---|---|---|
| 5,362,662 | 11/1994 | Ando et al. | 437/52 |
| 5,422,289 | 6/1995 | Pierce | 437/32 |
| 5,451,804 | 9/1995 | Lur et al. | 257/330 |
| 5,460,993 | 10/1995 | Hsu et al. | 437/44 |
| 5,478,767 | 12/1995 | Hong | 437/43 |
| 5,504,031 | 4/1996 | Hsu et al. | 437/57 |
| 5,512,506 | 4/1996 | Chang et al. | 437/44 |
| 5,518,944 | 5/1996 | Hiroki et al. | 437/44 |
| 5,538,913 | 7/1996 | Hong | 437/44 |
| 5,545,579 | 8/1996 | Liang et al. | 437/44 |
| 5,547,884 | 8/1996 | Yamaguchi et al. | 437/43 |
| 5,554,550 | 9/1996 | Yang | 437/43 |
| 5,567,635 | 10/1996 | Acovic et al. | 437/43 |
| 5,571,738 | 11/1996 | Krivokapic | 437/44 |
| 5,574,302 | 11/1996 | Wen et al. | 257/330 |
| 5,587,331 | 12/1996 | Jun | 437/41 |
| 5,599,726 | 2/1997 | Pan | 437/41 |
| 5,610,091 | 3/1997 | Cho | 437/43 |
| 5,633,200 | 5/1997 | Hu | 438/653 |
| 5,640,034 | 6/1997 | Malhi | 257/341 |

METHOD OF FORMING TRENCH TRANSISTOR WITH METAL SPACERS

BACKGROUND OF THE INVENTION

1. Field of the Invention

The present invention relates to integrated circuits, and more particularly to insulated-gate field-effect transistors.

2. Description of Related Art

An insulated-gate field-effect transistor (IGFET), such as a metal-oxide semiconductor field-effect transistor (MOSFET), uses a gate electrode to control an underlying surface channel joining a source and a drain. The channel, source and drain are located in a semiconductor substrate, with the substrate being doped oppositely to the source and drain. The gate electrode is separated from the semiconductor substrate by a thin insulating layer such as a gate oxide. The operation of the IGFET involves application of an input voltage to the gate electrode, which sets up a transverse electric field in the channel in order to modulate the longitudinal conductance of the channel.

In typical IGFET processing, the source and drain are formed by introducing dopants of a second conductivity type (P or N) into the semiconductor substrate of a first conductivity type N or P) using a patterned gate electrode as a mask. This self-aligning procedure tends to improve packing density and reduce parasitic overlap capacitances between the gate electrode and the source/drain regions.

Polysilicon (also called polycrystalline silicon, poly-Si or poly) thin films have many important uses in IGFET technology. One of the key innovations is the use of heavily doped polysilicon as the gate electrode in place of aluminum. Since polysilicon has the same high melting point as a silicon substrate, it can be deposited prior to source and drain formation, and serve as a mask during introduction of the source and drain regions by ion implantation. The resistance of polysilicon can be further reduced by forming a silicide on its top surface.

There is a relentless trend to miniaturize semiconductor dimensions. The number of IGFETs that can be manufactured on an integrated circuit chip can be increased by decreasing the horizontal dimensions. Resolution refers to the horizontal linewidth or space that a lithographic system can adequately print or resolve. Lithographic systems include optical projection and step and repeat equipment, and electron beam lithography equipment. In optical systems, for instance, resolution is limited by the equipment (e.g., diffraction of light, lens aberrations, mechanical stability), optical properties of the photoresist (e.g., resolution, photosensitivity, index of refraction), and process characteristics (e.g., softbake step, develop step, postbake step, and etching step).

Furthermore, scaling down the horizontal dimensions generally requires a corresponding decrease in the vertical dimensions. As IGFET vertical dimensions are reduced and the supply voltage remains constant (e.g., 3V), the maximum lateral electric field in the channel near the drain tends to increase. If the electric field becomes strong enough, it can give rise to so-called hot-carrier effects. For instance, hot electrons substrate and the gate insulator thereby causing hot carriers to become injected into the gate insulator. Trapped charge in the gate insulator due to injected hot carriers accumulates over time and can lead to a permanent change in the threshold voltage of the device.

A number of techniques have been utilized to reduce hot carrier effects. One such technique is a lightly doped drain (LDD). The LDD reduces hot carrier effects by reducing the maximum lateral electric field. Reducing the electric field on the order of 30–40% can reduce hot-electron-induced currents by several orders of magnitude. The drain is typically formed by two ion implants. A light implant is self-aligned to the gate electrode, and a heavy implant is self-aligned to the gate electrode on which sidewall spacers have been formed. The spacers are typically oxides or nitrides. The purpose of the lighter first dose is to form a lightly doped region of the drain (or LDD) at the edge near the channel. The second heavier dose forms a low resistivity region of the drain, which is subsequently merged with the lightly doped region. Since the heavily doped region is farther away from the channel than a conventional drain structure, the depth of the heavily doped region can be made somewhat greater without adversely affecting the device characteristics. The lightly doped region is not necessary for the source (unless bidirectional current is used), however LDD structures are typically formed for both the source and drain to avoid the need for an additional masking step.

Disadvantages of LDDs are their increased fabrication complexity compared to conventional drain structures, and parasitic resistance. LDDs exhibit relatively high parasitic resistance due to their light doping levels. During operation, the LDD parasitic resistance can decrease drain current, which in turn may reduce the speed of the IGFET.

In the manufacture of integrated circuits, the planarization of semiconductor wafers is becoming increasingly important as the number of layers used to form integrated circuits increases. For instance, the gate electrode and/or metallization layers formed to provide interconnects between various devices may result in nonuniform surfaces. The surface nonuniformities may interfere with the optical resolution of subsequent lithographic steps, leading to difficulty with printing high resolution patterns. The surface nonuniformities may also interfere with step coverage of subsequently deposited metal layers and possibly cause open circuits.

Accordingly, a need exists for an IGFET that can be manufactured with reduced horizontal dimensions, that preferably includes an LDD with reduced parasitic resistance as well as a substantially planar top surface. It is especially desirable that the IGFET have a channel length that can be significantly smaller than the minimum resolution of the available lithographic system.

SUMMARY OF THE INVENTION

The present invention provides an insulated-gate field-effect transistor (IGFET) with a gate electrode in a trench (i.e., a trench transistor) and metal spacers in the trench. A gate insulator is disposed on the bottom surface of the trench, the gate electrode is disposed on the gate insulator, metal spacers are disposed between the gate electrode and opposing sidewalls of the trench, and protective insulators are disposed between the gate electrode and the metal spacers. The source, drain and channel are adjacent to the bottom surface of the trench. Preferably, the channel is substantially aligned with the bottom surface of the gate electrode. If the trench length corresponds to the minimum resolution of a lithographic system, then the channel length is significantly smaller than the minimum resolution. Furthermore, lightly doped source and drain regions adjacent to the channel can contact the metal spacers at the bottom surface of the trench, and the gate electrode can be substantially aligned with the top surface of the substrate. In this manner, a highly miniaturized IGFET having an LDD with reduced parasitic resistance can be produced.

A key feature of the invention is the use of metal spacers in the trench, adjacent to the bottom surface and sidewalls of the trench, in contact with the source and drain, and electrically isolated from the gate electrode.

Preferably, the source and drain include heavily doped regions that extend to the top surface of the substrate and contact the metal spacers at the sidewalls, and also include lightly doped regions that contact the metal spacers at the bottom surface. In this manner, the metal spacers reduce the parasitic resistance of the lightly doped regions between the heavily doped regions and the channel. It is also preferred that protective insulators are disposed between the gate electrode and the metal spacers, that substantially all of the gate electrode is within the trench, and that the channel length is less than half the trench length and less than 2000 angstroms. As exemplary materials, the gate electrode is polysilicon, the gate insulator and protective insulators are a continuous layer of silicon dioxide, and the metal spacers are a highly conductive metal such as aluminum, tungsten, titanium, cobalt, or combinations thereof.

Another aspect of the invention is a method of forming an IGFET. The method includes forming a trench with a bottom surface and opposing sidewalls in a substrate, forming a source and drain adjacent to the bottom surface, then forming metal spacers on the bottom surface and in contact with the source and drain, forming a gate insulator on the bottom surface between the metal spacers, forming protective insulators on the metal spacers, and forming a gate electrode on the gate insulator and protective insulators such that the gate electrode is spaced from and electrically isolated from the metal spacers and the substrate. The gate insulator and protective insulators can be formed simultaneously as a continuous insulative layer. The source and drain are implanted and activated before forming the metal spacers in order to avoid melting the metal spacers. Preferably, the metal spacers are formed by depositing a blanket layer of conductive metal over the substrate and then applying an anisotropic etch, and the gate electrode is formed by depositing a blanket layer of gate electrode material over the substrate and then polishing the gate electrode material until the gate electrode is substantially aligned with a planar top surface of the substrate.

A first embodiment of the method includes providing a P-type substrate, implanting an N+doped layer into the substrate, patterning a photoresist layer over the substrate, etching a trench completely through the doped layer and partially through the substrate to split the doped layer into source and drain regions, stripping the photoresist layer, applying a high-temperature anneal to form the source and drain by activating the source and drain regions and diffusing the source and drain regions beneath the bottom surface, forming metal spacers on the bottom surface and sidewalls of the trench, forming a gate insulator on a central portion of the bottom surface between the metal spacers, forming protective insulators on the metal spacers, depositing a gate electrode material over the substrate, and polishing the gate electrode material to form a gate electrode substantially aligned with a planar top surface of the substrate.

A second embodiment of the method includes providing a P-type substrate, implanting a doped layer that includes an N+ doped upper layer and an N−doped lower layer into the substrate, patterning a photoresist layer over the substrate, etching a trench completely through the doped upper layer and partially through the doped lower layer to split the doped upper layer into heavily doped source and drain regions, stripping the photoresist layer, forming disposable spacers on the bottom surface and sidewalls of the trench, counter-doping the substrate beneath a central portion of the bottom surface between the disposable spacers to form a P-type channel that splits the doped lower layer into lightly doped source and drain regions, stripping the disposable spacers, applying a high-temperature anneal to form the source and drain by activating the lightly and heavily doped source and drain regions, forming metal spacers on the bottom surface and sidewalls of the trench, forming a gate insulator on the central portion of the bottom surface between the metal spacers, forming protective insulators on the metal spacers, depositing a gate electrode material over the substrate, and polishing the gate electrode material to form a gate electrode substantially aligned with a planar top surface of the substrate.

A third embodiment of the method includes providing a P-type substrate, implanting an N+ doped first layer into the substrate, patterning a photoresist layer over the substrate, etching a trench completely through the doped first layer and partially through the substrate to split the doped first layer into heavily doped source and drain regions, implanting an N−doped second layer into the substrate beneath the bottom surface, stripping the photoresist layer, forming disposable spacers on the bottom surface and sidewalls of the trench, counterdoping the substrate beneath a central portion of the bottom surface between the disposable spacers to form a P-type channel that splits the doped second layer into lightly doped source and drain regions, stripping the disposable spacers, applying a high-temperature anneal to form the source and drain by activating and merging the lightly and heavily doped source and drain regions, forming metal spacers on the bottom surface and sidewalls of the trench, forming a gate insulator on the central portion of the bottom surface between the metal spacers, depositing a gate electrode material over the substrate, and polishing the gate electrode material to form a gate electrode substantially aligned with a planar top surface of the substrate.

A primary advantage of the invention is that the IGFET can have a channel length that is significantly smaller than the minimum resolution of the available lithographic system, thereby providing a next generation transistor with the present generation lithography. As further advantages, the source and drain can include lightly doped regions adjacent to the channel and heavily doped regions adjacent to the top surface of the substrate, the metal spacers can reduce the parasitic resistance of the lightly doped regions, and the gate electrode can be substantially aligned with the top surface of the substrate.

These and other aspects, features and advantages of the invention will be further described and more readily apparent from a review of the detailed description of the preferred embodiments which follow.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

Figure 1A:
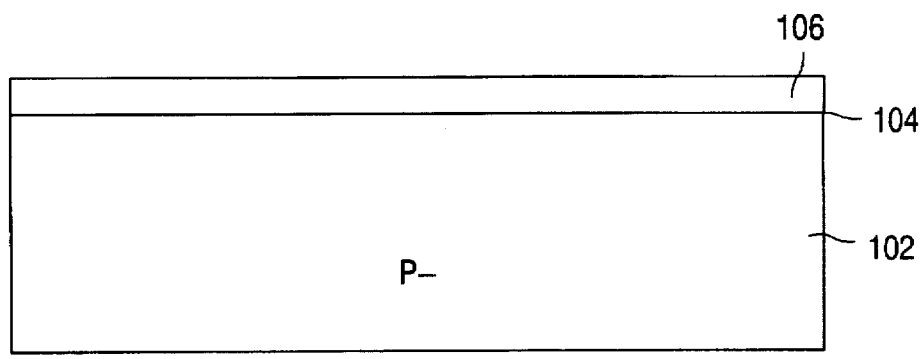
FIGS. 1A–1J show cross-sectional views of successive process steps for forming an IGFET with a gate electrode and metal spacers in a trench in accordance with a first embodiment of the invention.

In the drawings, depicted elements are not necessarily drawn to scale and like or similar elements may be designated by the same reference numeral throughout the several views.

FIGS. 1A–1J show cross-sectional views of successive process steps for forming an IGFET with a gate electrode and metal spacers in a trench in accordance with a first embodiment of the invention.

In FIG. 1A, a semiconductor substrate suitable for integrated circuit manufacture is provided. For instance, substrate 102 includes a P–epitaxial surface layer with a <100> orientation, a boron concentration of $1\times10^{15}$ atoms/cm$^3$ and a resistivity of 12 ohm-cm. Preferably, the epitaxial surface layer is disposed on a P+ base layer (not shown) and has a planar top surface 104. Oxide layer 106 with a thickness of 500 angstroms is formed on top surface 104.

Figure 1B:
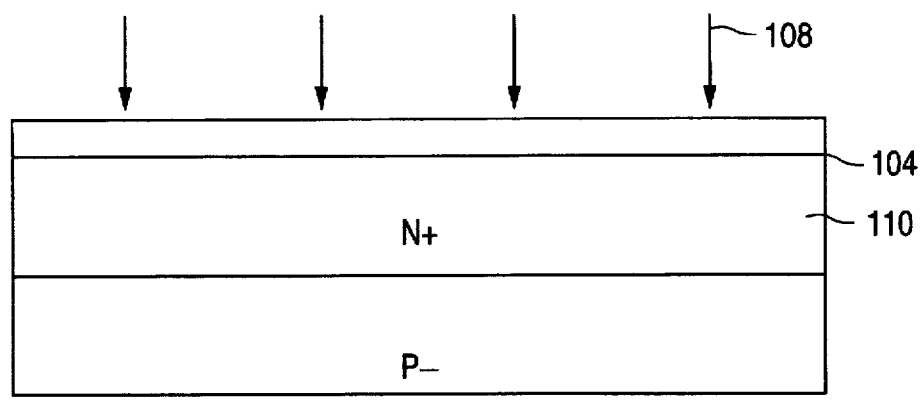

In FIG. 1B, the structure is subjected to ion implantation of arsenic and phosphorus, indicated by arrows 108, at a combined dosage in the range of $1\times10^{15}$ to $5\times10^{15}$ atoms/cm$^2$ and an energy in the range of 2 to 80 kiloelectron-volts. Preferably, the arsenic dosage is about an order of magnitude greater than the phosphorus dosage. This forms N+ doped layer 110 in substrate 102 with a combined arsenic and phosphorus concentration in the range of $1\times10^{20}$ to $1\times10^{21}$ atoms/cm$^3$ and a depth of 1800 angstroms below top surface 104. Doped layer 110 has a graded doping profile in the vertical direction so that the deepest regions are the most lightly doped.

Figure 1C:
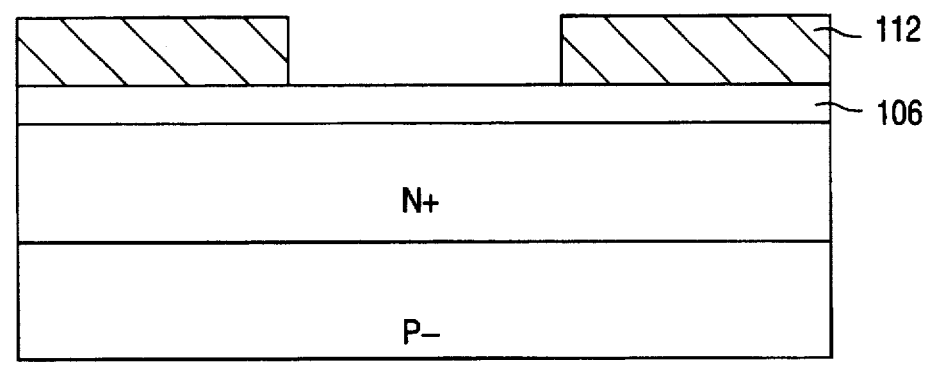

In FIG. 1C, photoresist layer 112 is deposited as a continuous layer on oxide layer 106 and then selectively irradiated using a photolithographic system, such as a step and repeat optical projection system, in which line ultraviolet light from a mercury-vapor lamp is projected through a reticle and a focusing lens to project the desired image pattern on photoresist layer 112. Thereafter, photoresist layer 112 is developed and the irradiated portions are removed to provide an opening that defines the lateral boundaries for a trench. The minimum resolution (i.e. linewidth and spacing) of the step and repeat system is 4000 angstroms (0.4 microns). Therefore, to reduce feature sizes, the length of the opening is 4000 angstroms.

Figure 1D:
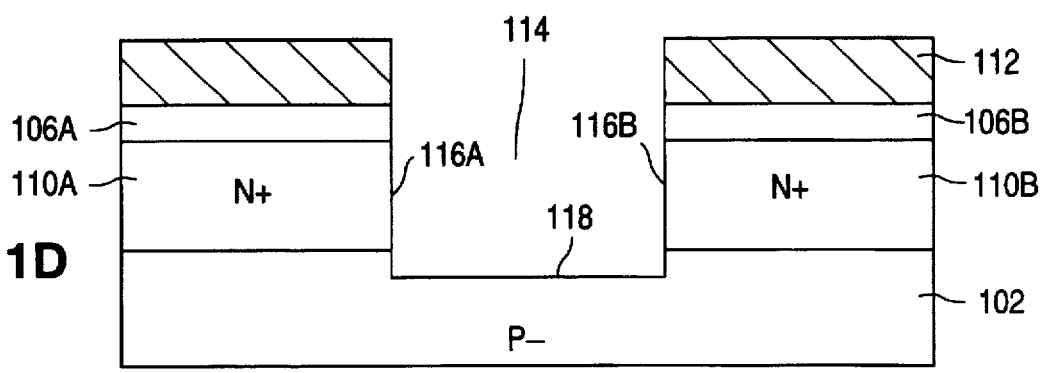

In FIG. 1D, an anisotropic etch such as a reactive ion etch is applied using photoresist layer 112 as an etch mask. The etch removes the exposed portion of oxide layer 106, thereby splitting oxide layer 106 into oxide layer regions 106A and 106B. The etch also forms trench 114 completely through doped layer 110, but only partially through substrate 102. Trench 114 has opposing vertical sidewalls 116A and 116B, and planar bottom surface 118. For illustration purposes, trench 114 has a depth (or height) of 2000 angstroms below top surface 104, and a length (between sidewalls 116A and 116B) of 4000 angstroms. The 4000 angstrom trench length represents the minimum resolution (or linewidth) of the photolithographic system. The trench splits doped layer 110 into source region 110A and drain region 110B, which will subsequently be diffused beneath bottom surface 118 as described below.

Figure 1E:
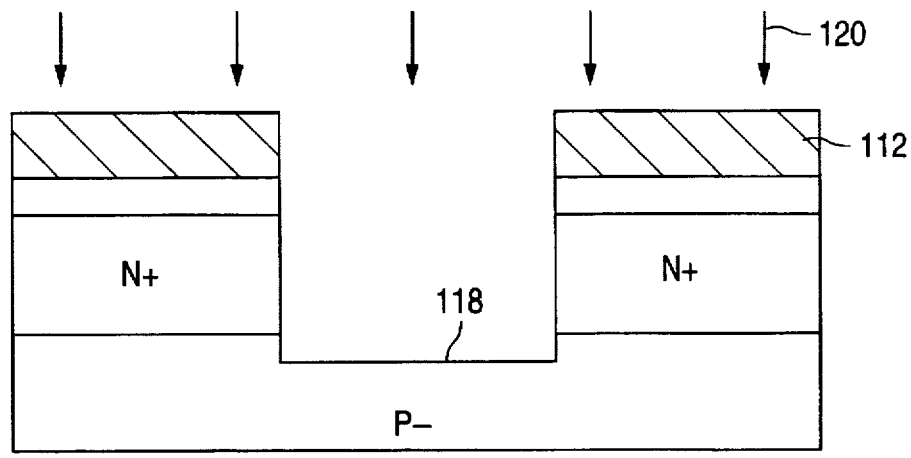

In FIG. 1E, a channel implant is provided by boron, as indicated by lines 120, which passes through bottom surface 118 using photoresist layer 112 as an implant mask. The channel implant includes a well implant, then a punch-through implant, and then a threshold voltage implant. The well implant provides a more uniform background doping, the punchthrough implant provides the channel with greater robustness to punchthrough voltages, and the threshold voltage implant sets the threshold voltage of the IGFET to approximately 0.4 to 0.7 volts. The well implant is provided by boron at a dose in the range of $1\times10^{12}$ to $1\times10^{13}$ atoms/cm$^2$ and an energy in the range of 100 to 170 kiloelectron-volts, the punchthrough implant is provided by boron at a dose in the range of $1\times10^{12}$ to $1\times10^{13}$ atoms/cm$^2$ and an energy in the range of 40 to 100 kiloelectron-volts, and the threshold voltage implant is provided by boron at a dose in the range of $1\times10^{12}$ to $1\times10^{13}$ atoms/cm$^2$ and an energy in the range of 2 to 30 kiloelectron-volts. The channel implant has a boron concentration on the order of $1\times10^{17}$ atoms/cm$^3$ and provides suitable doping for a channel adjacent to bottom surface 118.

Figure 1F:
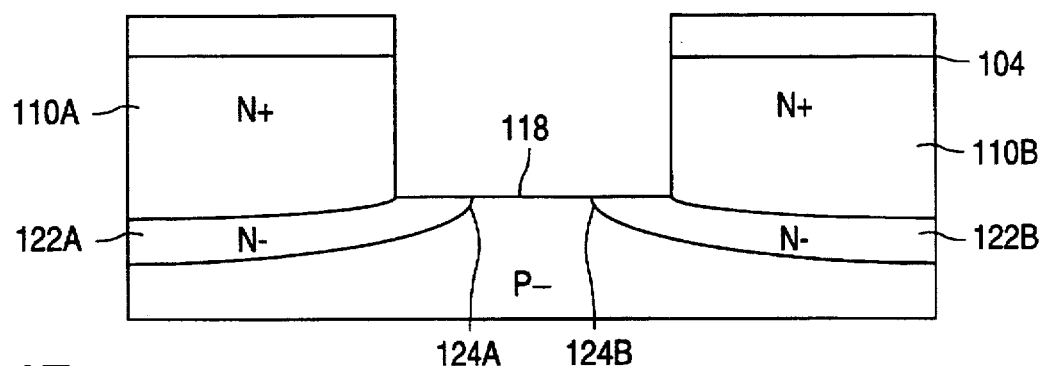

In FIG. 1F, photoresist layer 112 is stripped, and a rapid thermal anneal on the order of 950° to 1050° C. for 10 to 30 seconds is applied to remove crystalline damage and to activate and drive-in the implanted dopants. In source region 110A and drain region 110B, the phosphorus diffuses far more rapidly than the arsenic. Also, as mentioned above, source region 110A and drain region 110B are graded so that the deepest regions are the most lightly doped. As a result, lightly doped source region 122A and lightly doped drain region 122B diffuse from source region 110A and drain region 110B respectively, diffuse beneath trench 114, and are adjacent to the outer portions of bottom surface 118. Lightly doped source and drain regions 122A and 122B are doped N–, with a phosphorus concentration on the order of $5\times10^{17}$ to $5\times10^{18}$ atoms/cm$^3$ since the diffusion is provided mainly by phosphorus (a rapid diffuser) without arsenic (a slow diff-user). Furthermore, source region 110A and drain region 110B remain heavily doped near top surface 104. Advantageously, lightly doped source and drain regions 122A and 122B do not diffuse any substantial amount beneath a central portion of bottom surface 118, between the outer portions, but instead form channel junctions 124A and 124B, respectively, that are substantially aligned with the central portion of bottom surface 118.

Figure 1G:
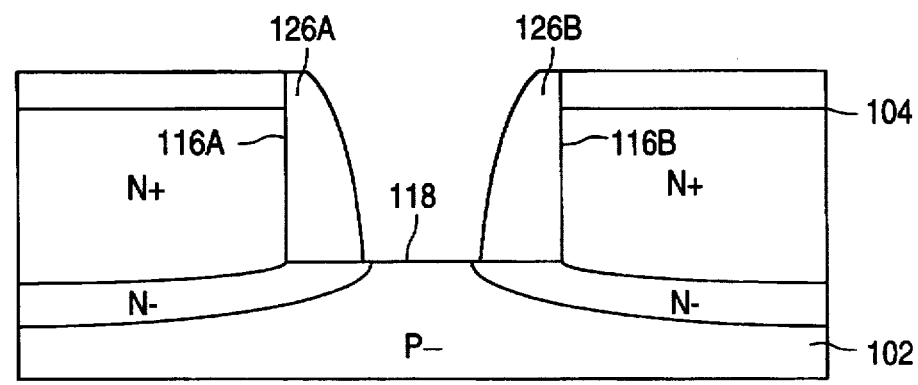

In FIG. 1G, a brief wet chemical etch is applied to remove any native oxide in trench 114, a blanket layer of a conductive metal that is 2500 angstroms thick is deposited over substrate 102, and then an anisotropic etch such as a reactive ion etch is applied to the conductive metal to form metal spacers 126A and 126B. Preferred conductive metals include aluminum, tungsten, titanium, cobalt, and combinations thereof. The spacer etch is highly selective of the conductive metal with respect to silicon, so only a negligible amount of substrate 102 is removed. Metal spacers 126A and 126B contact and completely cover sidewalls 116A and 116B, respectively, and extend above top surface 104. Metal spacers 126A and 126B also contact the outer portions of bottom surface 118, adjacent to sidewalls 116A and 116B, but leave the central portion of bottom surface 118 exposed. Metal spacers 126A and 126B each have a length of 1200 angstroms (as measured laterally from sidewalls 116A and 116B) along the outer portions of bottom surface 118. Therefore, the central portion of bottom surface 118 has a length of 1600 angstroms (4000–2400 angstroms).

The dimensions of the metal spacers depend on several variables, including the height and length of the trench, the thickness of the blanket layer of conductive metal, and the duration of the spacer etch. The metal spacer dimensions depend on the desired scaling of the trench length to the channel length. However, the channel length depends on various factors including the characteristics of the source and drain regions and the high-temperature anneal. Preferably, the channel length is less than half of the trench length, and is less than 2000 angstroms. Furthermore, as described below, the channel shall be substantially aligned with the bottom surface of a gate electrode.

Figure 1H:
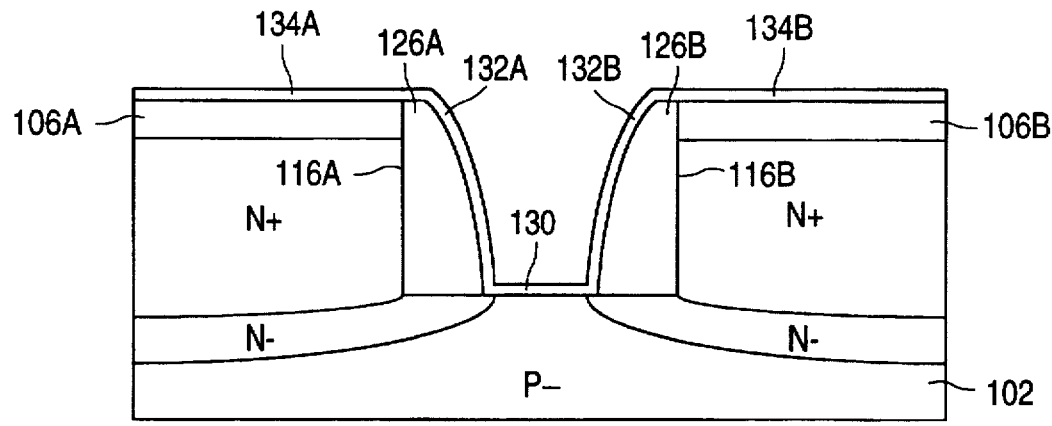

In FIG. 1H, a thin layer of silicon dioxide, 50 angstroms thick, is deposited over substrate 102 using a low-temperature deposition process that is well below the melting points of metal spacers 126A and 126B. As a result, gate oxide 130 is formed on the central portion of bottom surface 118, protective oxides 132A and 132B are formed on the sides of metal spacers 126A and 126B, respectively, opposite sidewalls 116A and 116B, respectively, and oxide segments 134A and 134B are formed on oxide layer regions 106A and 106B, respectively. Thus, gate oxide 130, protective oxides 132A and 132B, and oxide segments 134A and 134B form a continuous oxide layer over substrate 102.

Figure 1I:
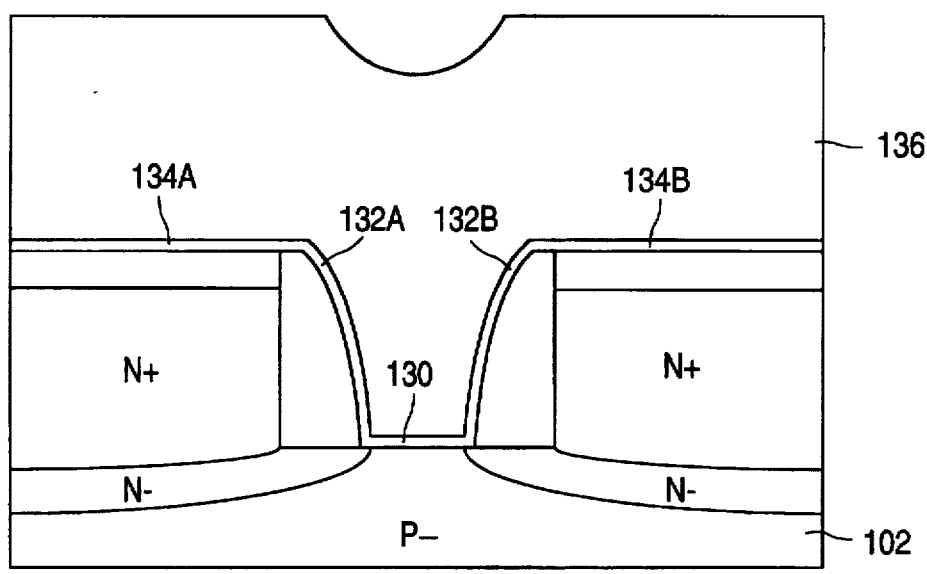

In FIG. 1I, a blanket layer of doped polysilicon 136 with a thickness of 4000 angstroms is deposited by low pressure chemical vapor deposition over substrate 102. Polysilicon 136 contacts gate oxide 130, protective oxides 132A and 132B, and oxide segments 134A and 134B, and fills the remaining space in trench 114.

Figure 1J:
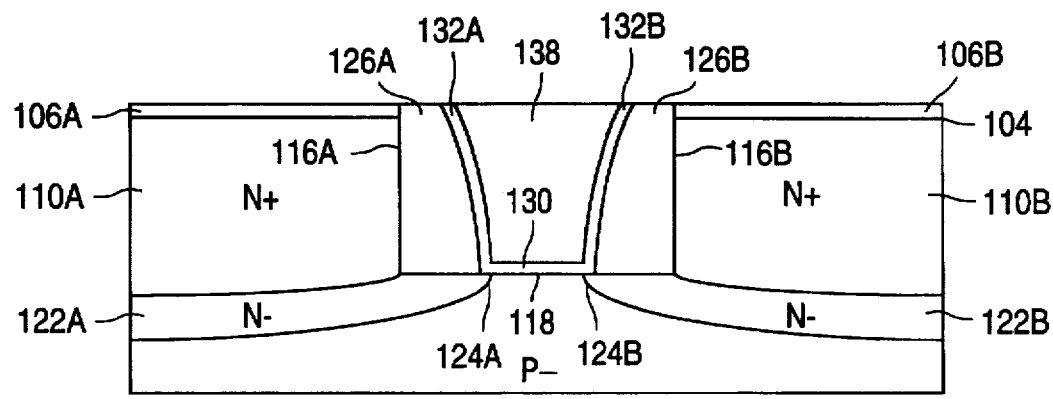

In FIG. 1J, the structure is planarized by applying chemical-mechanical polishing in the presence of an abrasive slurry. The polishing grinds down polysilicon 136, completely removes oxide segments 134A and 134B, removes portions of oxide layer regions 106A and 106B, metal spacers 126A and 126B, and protective oxides 132A and 132B above top surface 104, but is discontinued before reaching top surface 104. After polishing occurs, the remaining portion of polysilicon 136 forms polysilicon gate electrode 138. The top surfaces of metal spacers 126A and 126B, protective oxides 132A and 132B, oxide layer regions 106A and 106B and polysilicon gate electrode 138 are aligned and form a planar surface. Polysilicon gate electrode 138 extends merely 50 angstroms above top surface 104, and therefore is substantially aligned with top surface 104. Furthermore, substantially all of polysilicon gate electrode 138 is within trench 114, and no portion of polysilicon gate electrode 138 overlaps top surface 104. Of importance, polysilicon gate electrode 138 is spaced from and electrically isolated from metal spacers 126A and 126B and substrate 102.

Junction 124A is substantially aligned with a first side of polysilicon gate electrode 138 where it contacts gate oxide 130, and junction 124B is substantially aligned with a second side of polysilicon gate electrode 138 where it contacts gate oxide 130. Thus, junctions 124A and 124B define a channel, substantially aligned with the bottom surface of gate electrode 138, with a length of approximately 1600 angstroms, for an N-channel MOSFET controlled by polysilicon gate electrode 138 that includes a source provided by source regions 110A and 122A, and a drain provided by drain regions 110B and 122B.

Moreover, heavily doped source and drain regions 110A and 110B contact metal spacers 126A and 126B, respectively, at sidewalls 116A and 116B, respectively, of the trench 114, whereas lightly doped source and drain regions 122A and 122B contact metal spacers 126A and 126B, respectively, at bottom surface 118. Metal spacers 126A and 126B have far lower electrical resistance than lightly doped source and drain regions 122A and 122B. As a result, metal spacers 126A and 126B significantly lower the resistance between heavily doped source and drain regions 110A and 110B and channel junctions 124A and 124B, respectively, thereby reducing the parasitic resistance of lightly doped source and drain regions 122A and 122B, respectively.

FIGS. 2A–2K show cross-sectional views of successive process steps for forming an IGFET with a gate electrode and metal spacers in a trench in accordance with a second embodiment of the invention. It may be desirable to implant the source and drain regions to a greater depth than the bottom surface of the trench, particularly if the implanted source and drain regions may not diffuse far enough to form channel junctions substantially aligned with the bottom surface of the gate electrode. The primary difference between the second embodiment and the first embodiment is that in the second embodiment, the doped layer is implanted deeper than the trench, disposable spacers are formed in the trench, the channel implant counterdopes the doped layer beneath the central portion of the bottom surface using the disposable spacers as an implant mask, and the doped layer diffuses only slightly. Unless otherwise noted, the elements for the second embodiment (e.g., substrate 202, gate oxide 230, etc.) are similar to elements of the first embodiment (e.g., substrate 102, gate oxide 230, etc.), and the description of related elements and process steps need not be repeated.

Figure 2A:
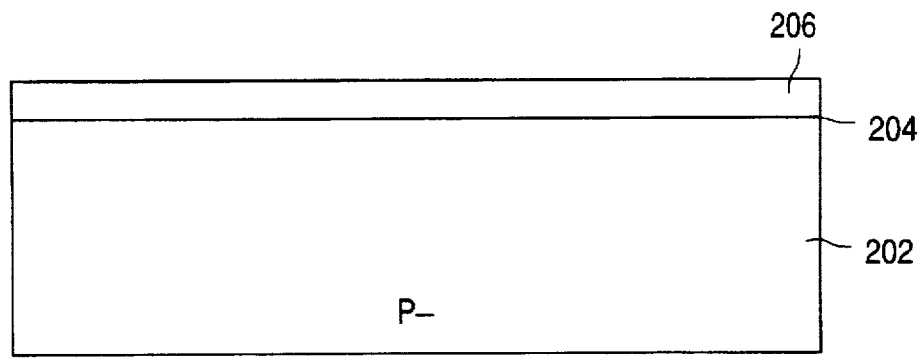
FIGS. 2A–2K show cross-sectional views of successive process steps for forming an IGFET with a gate electrode and metal spacers in a trench in accordance with a second embodiment of the invention.

In FIG. 2A, semiconductor substrate 202 suitable for integrated circuit manufacture is provided. Substrate 202 includes a P-epitaxial surface layer with a planar top surface 204. Oxide layer 206 is formed on substrate 202.

Figure 2B:
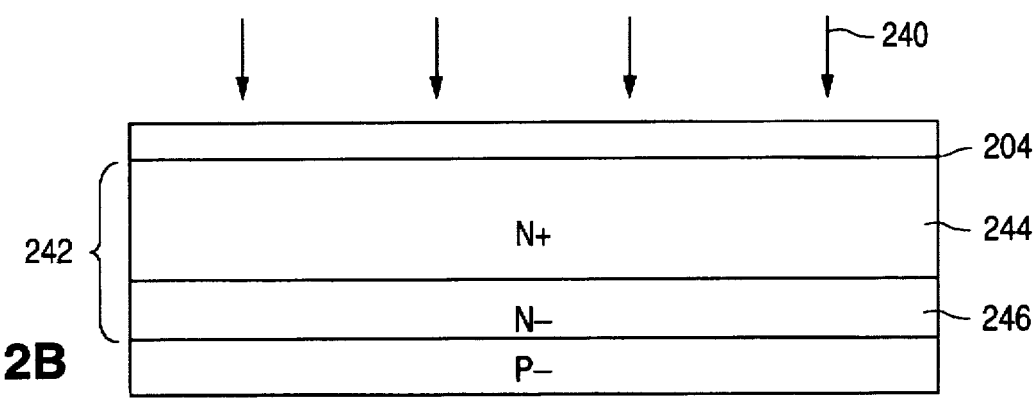

In FIG. 2B, the structure is subjected to ion implantation of arsenic, indicated by arrows 240, at a first dosage in the range of $1\times10^{15}$ to $5\times10^{15}$ atoms/cm$^2$ at a first energy of about 30 kiloelectron-volts, and a second dosage in the range of $1\times10^{13}$ to $5\times10^{14}$ atoms/cm$^2$ at a second energy of about 60 kiloelectron-volts. This forms doped layer 242, consisting of N+ doped upper layer 244 with an arsenic concentration in the range of $1\times10^{20}$ to $1\times10^{21}$ atoms/cm$^3$ and a depth of 1800 angstroms below top surface 204, and N-doped lower layer 246 with an arsenic concentration in the range of $5\times10^{17}$ to $5\times10^{18}$ atoms/cm$^3$ and a depth of 500 angstroms below doped upper layer 244. Doped layer 242 differs from doped layer 110 in several respects. First, doped layer 242 is deeper than doped layer 110 by 500 angstroms. Second, doped layer 242 is doped solely by arsenic. Third, doped layer 242 includes a heavily doped upper layer above a lightly doped lower layer.

Figure 2C:
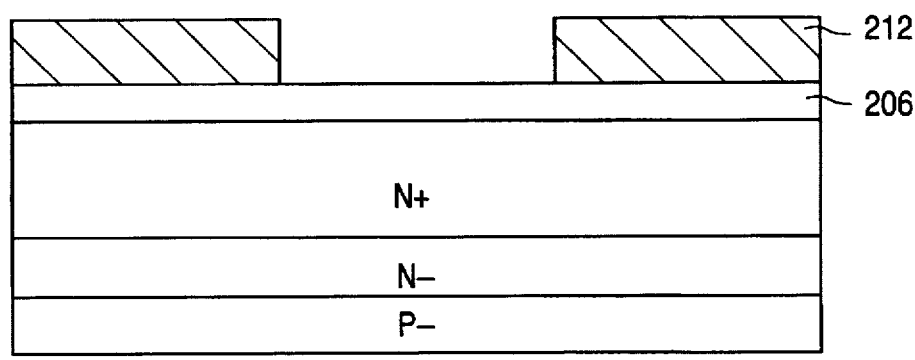

In FIG. 2C, photoresist layer 212 is deposited as a continuous layer on oxide layer 206 and then selectively irradiated using a step and repeat system. Thereafter, photoresist layer 212 is developed and the irradiated portions are removed to provide an opening that defines the lateral boundaries for a trench.

Figure 2D:
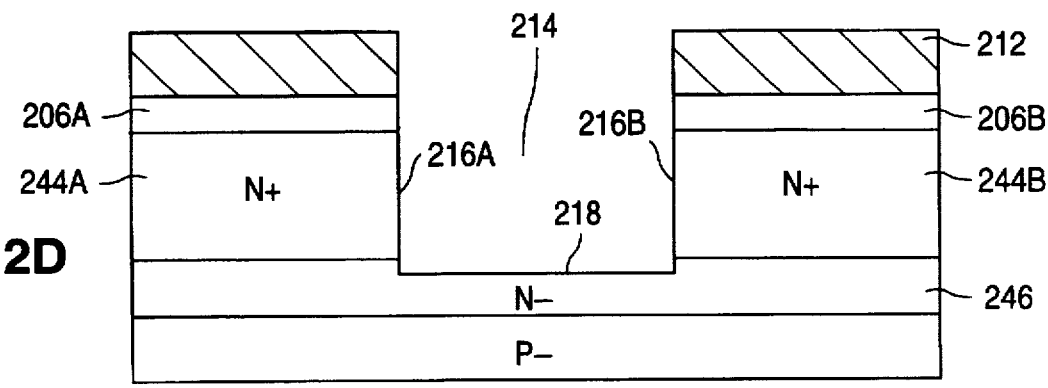

In FIG. 2D, an anisotropic etch is applied using photoresist layer 212 as an etch mask to form trench 214 completely through doped upper layer 244, partially through doped lower layer 246, and thus partially through substrate 202. Trench 214 includes opposing vertical sidewalls 216A and 216B, and planar bottom surface 218. Trench 214 splits doped upper layer 244 into heavily doped source region 244A and heavily doped drain region 244B. In addition, oxide layer 206 is split into oxide layer regions 206A and 206B.

Figure 2E:
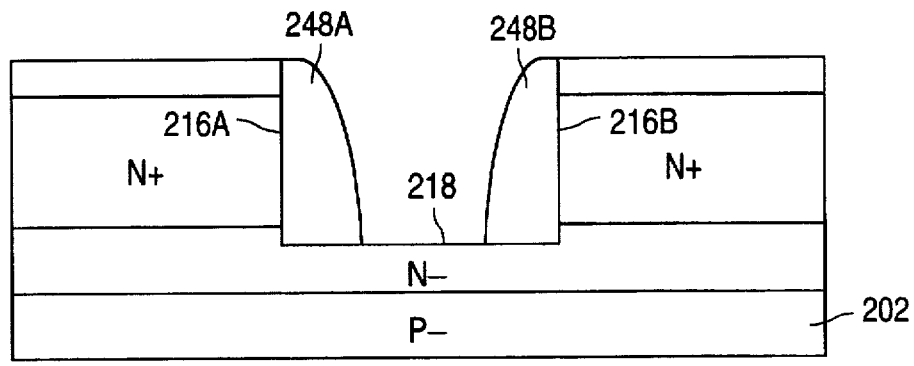

In FIG. 2E, photoresist layer 212 is stripped, a blanket layer of silicon nitride is conformally deposited over substrate 202, and then an anisotropic etch such as a reactive ion etch is applied to the silicon nitride layer to form nitride spacers 248A and 248B on sidewalls 216A and 216B, respectively, and on outer portions of bottom surface 218.

Nitride spacers 248A and 248B leave exposed a central portion of bottom surface 218.

Figure 2F:
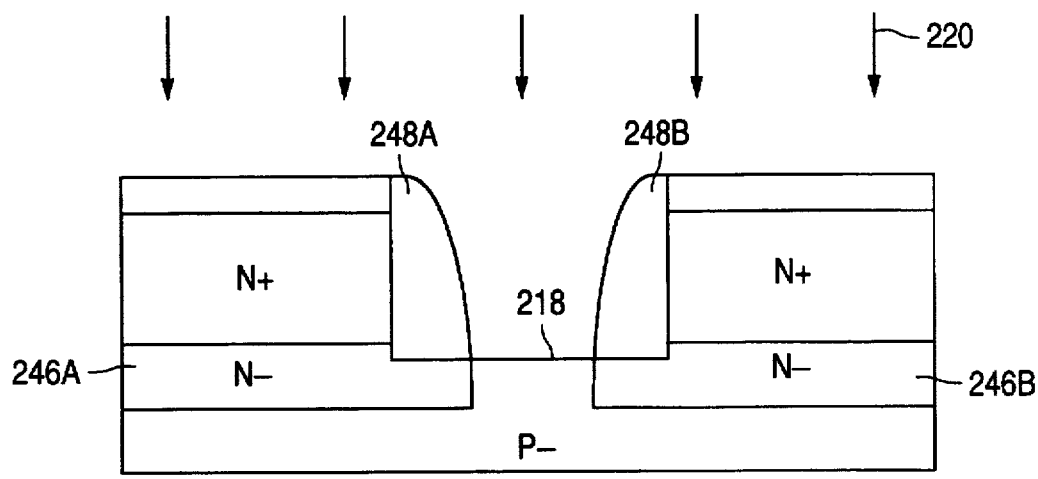

In FIG. 2F, a channel implant is provided by subjecting the structure to ion implantation of boron, as indicated by arrows 220. The channel implant differs from the channel implant in the first embodiment in several respects. First, the channel implant does not pass through all of bottom surface 218, instead, nitride spacers 248A and 248B provide an implant mask for the outer portions of bottom surface 218, and the channel implant passes through only the central portion of bottom surface 218. Second, the channel implant counterdopes doped lower layer 246 beneath the central portion of bottom surface 218, effectively splitting doped lower layer 246 into lightly doped source region 246A and lightly doped drain region 246B. Third, the boron dosage is about twice the boron dosage used in the first embodiment to assure adequate counterdoping of doped lower layer 246 beneath the central portion of bottom surface 218.

Figure 2G:
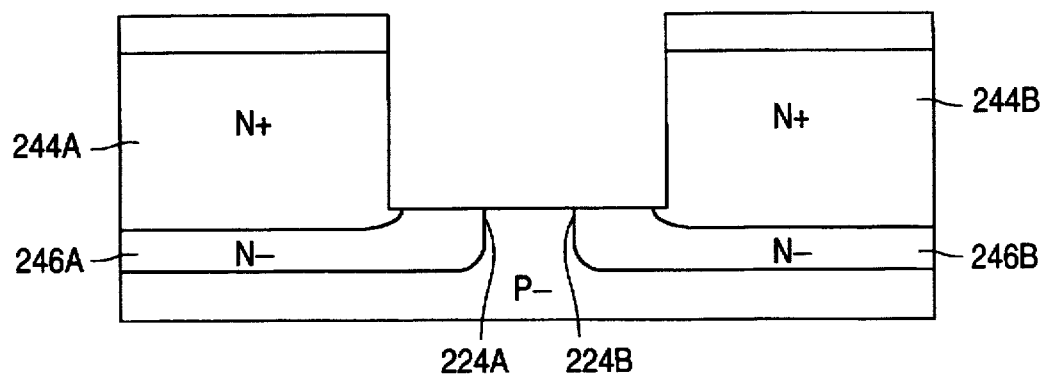

In FIG. 2G, nitride spacers 248A and 248B are stripped, and a rapid thermal anneal on the order of 950° to 1050° C. for 10 to 30 seconds is applied to remove crystalline damage and to activate and drive-in the implanted dopants. Since heavily doped and lightly doped source and drain regions 244A, 244B, 246A and 246B are doped solely by arsenic, very little diffusion occurs. As a result, lightly doped source and drain regions 246A and 246B form channel junctions 224A and 224B, respectively, that are substantially aligned with the central portion of bottom surface 218.

Figure 2H:
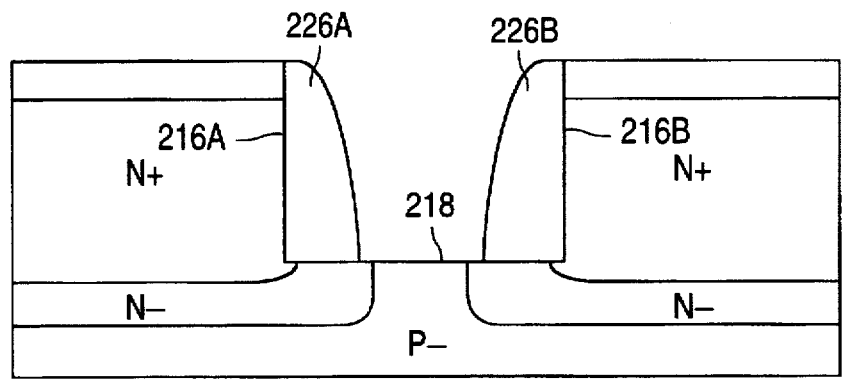

In FIG. 2H, a blanket layer of conductive metal is conformally deposited over substrate 202, and then an anisotropic etch is applied to form metal spacers 226A and 226B on sidewalls 216A and 216B, respectively, and on the outer portions of bottom surface 218. Metal spacers 226A and 226B leave exposed the central portion of bottom surface 218.

Figure 2I:
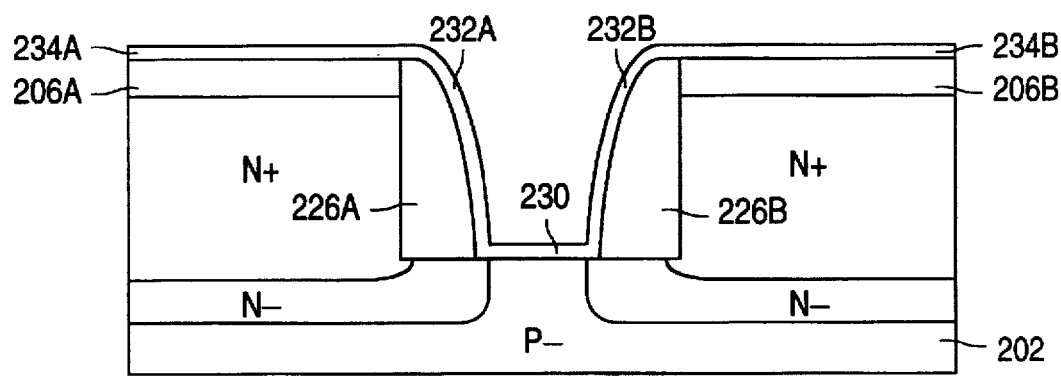

In FIG. 2I, an oxide layer is deposited over substrate 202 to form gate oxide 230 on the central portion of bottom surface 218, protective oxides 232A and 232B on metal spacers 226A and 226B, respectively, and oxide segments 234A and 234B on oxide layer regions 206A and 206B, respectively.

Figure 2J:
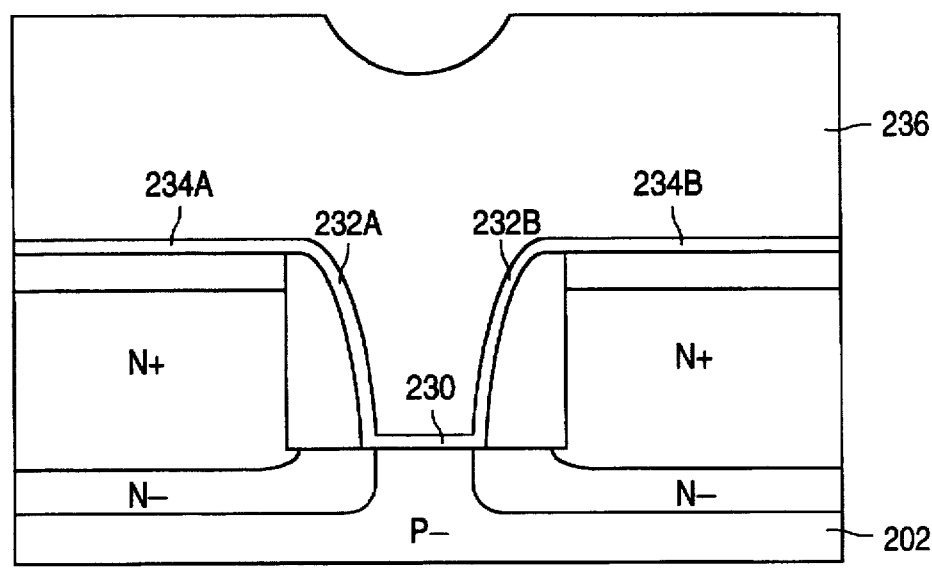

In FIG. 2J, a blanket layer of doped polysilicon 236 is deposited over substrate 202.

Polysilicon 236 contacts gate oxide 230, protective oxides 232A and 232B, and oxide segments 234A and 234B and fills the remaining space in trench 214.

Figure 2K:
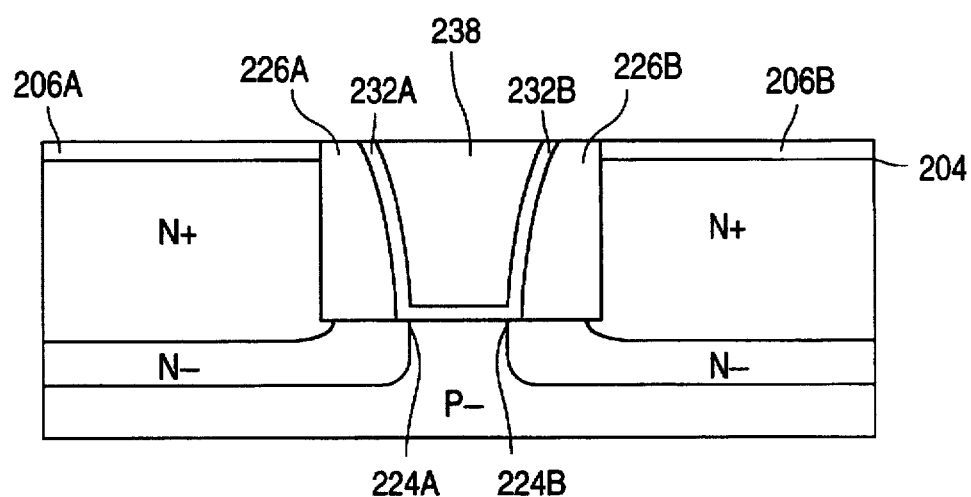

In FIG. 2K, the structure is planarized by applying chemical-mechanical polishing in the presence of an abrasive slurry. The polishing grinds down regions of polysilicon 236, but is discontinued before reaching top surface 204. The remaining portion of polysilicon 236 forms polysilicon gate electrode 238, which is aligned with metal spacers 226A and 226B, protective oxides 232A and 232B, and oxide layer regions 206A and 206B. Polysilicon gate electrode 238 is substantially aligned with top surface 204, and substantially all of polysilicon gate electrode 238 is within trench 214. Moreover, junctions 224A and 224B are substantially aligned with the bottom surface of polysilicon gate electrode 238.

FIGS. 3A–3L show cross-sectional views of successive process steps for forming an IGFET with a gate electrode and metal spacers in a trench in accordance with a third embodiment of the invention. It may desirable to implant lightly doped source and drain regions through the bottom surface of the trench, particularly if heavily doped source and drain regions may not diffuse far enough to form channel junctions substantially aligned with the bottom surface of the gate electrode. The primary difference between the third embodiment and the first embodiment is that in the third embodiment, a lightly doped layer is implanted through the bottom surface of the trench, disposable spacers are formed in the trench, the channel implant counterdopes the lightly doped layer beneath the central portion of the bottom surface using the disposable spacers as an implant mask, and the source and drain regions diffuse only slightly. Unless otherwise noted, the elements for the third embodiment (e.g., substrate 302, gate oxide 330, etc.) are similar to elements of the first embodiment (e.g., substrate 102, gate oxide 130, etc.), and the description of related elements and process steps need not be repeated.

Figure 3A:
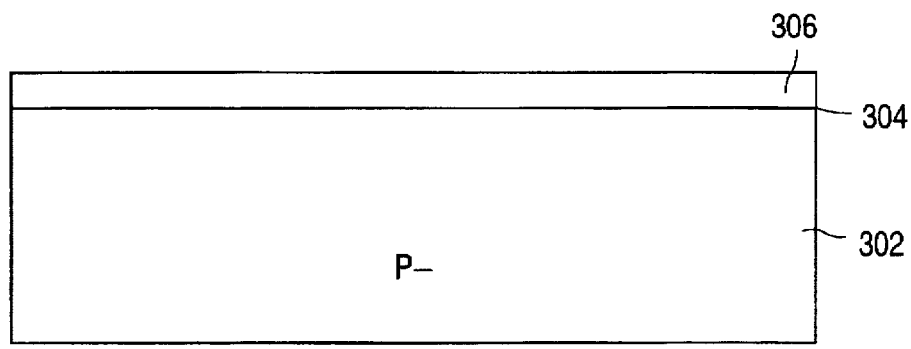
FIGS. 3A–3L show cross-sectional views of successive process steps for forming an IGFET with a gate electrode and metal spacers in a trench in accordance with a third embodiment of the invention.

In FIG. 3A, semiconductor substrate 302 suitable for integrated circuit manufacture is provided. Substrate 302 includes a P-epitaxial surface layer with a planar top surface 304. Oxide layer 306 is formed on substrate 302.

Figure 3B:
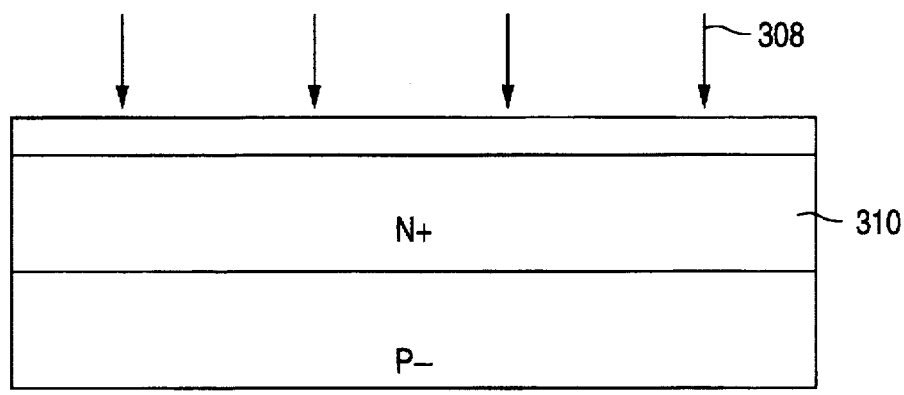

In FIG. 3B, doped layer 310 is implanted into substrate 302 by subjecting the structure to ion implantation of arsenic, as indicated by arrows 308. Doped layer 310 differs from doped layer 110 in that doped layer 310 is doped solely by arsenic, instead of arsenic and phosphorus.

Figure 3C:
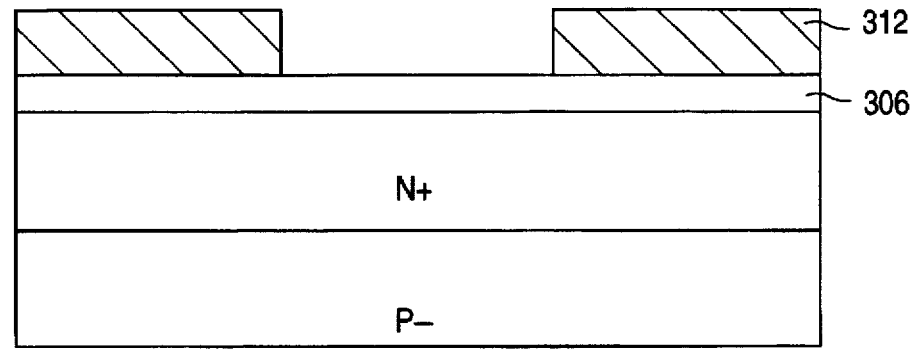

In FIG. 3C, photoresist layer 312 is deposited as a continuous layer on oxide layer 306 and then selectively irradiated using a step and repeat system. Thereafter, photoresist layer 312 is developed and the irradiated portions are removed to provide an opening that defines the lateral boundaries for a trench.

Figure 3D:
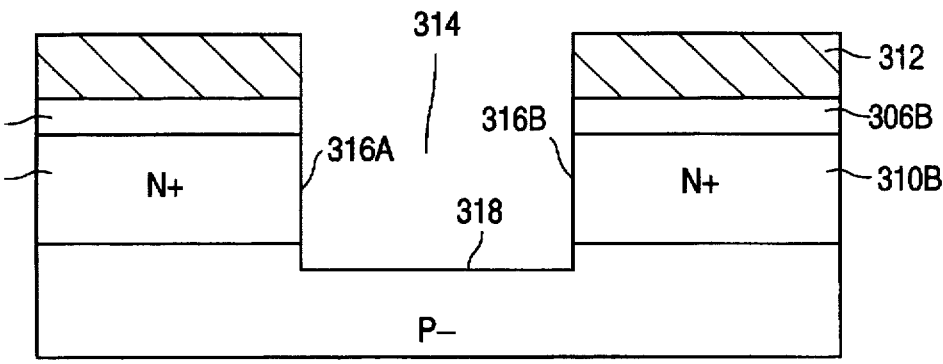

In FIG. 3D, an anisotropic etch is applied using photoresist layer 312 as an etch mask to form trench 314 completely through doped layer 310 and partially through substrate 302. Trench 314 includes opposing vertical sidewalls 316A and 316B, and planar bottom surface 318. Trench 314 splits doped layer 310 into heavily doped source and drain regions 310A and 310B. In addition, oxide layer 306 is split into oxide layer regions 306A and 306B.

Figure 3E:
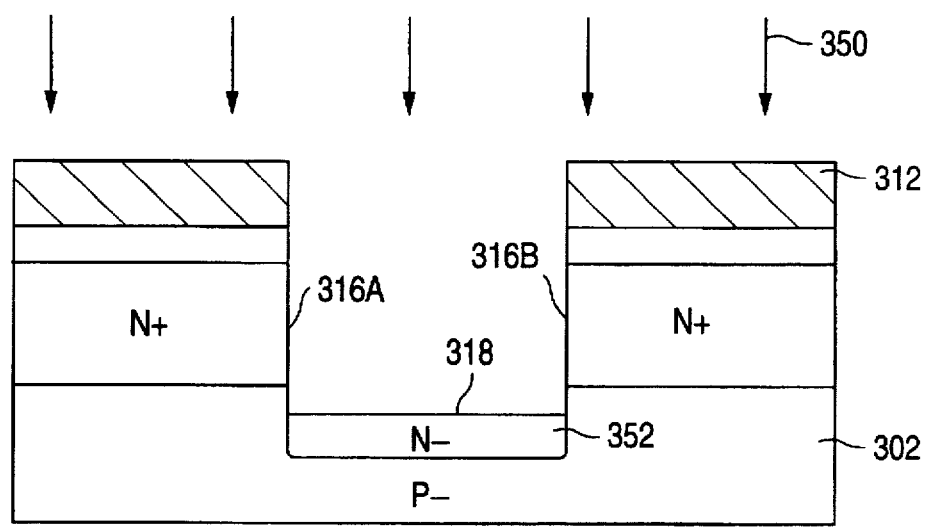

In FIG. 3E, the structure is subjected to an ion implant of arsenic, indicated by arrows 350, at a dosage in the range of $1 \times 10^{13}$ to $5 \times 10^{14}$ atoms/cm$^2$ and an energy in the range of 2 to 80 kiloelectron-volts using photoresist layer 312 as an implant mask. This forms N- doped layer 352 in substrate 302 beneath and adjacent to the bottom surface 318. Doped layer 352 is substantially aligned with sidewalls 316A and 316B.

Figure 3F:
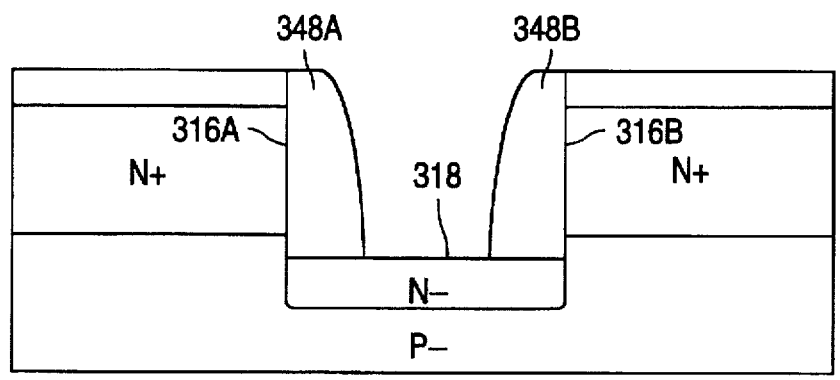

In FIG. 3F, photoresist layer 312 is stripped, a blanket layer of silicon nitride is conformally deposited over substrate 302, and then an anisotropic etch provided by a reactive ion etch is applied to the silicon nitride layer to form nitride spacers 348A and 348B on sidewalls 316A and 316B, respectively, and on outer portions of bottom surface 318. Nitride spacers 348A and 348B leave exposed a central portion of bottom surface 318.

Figure 3G:
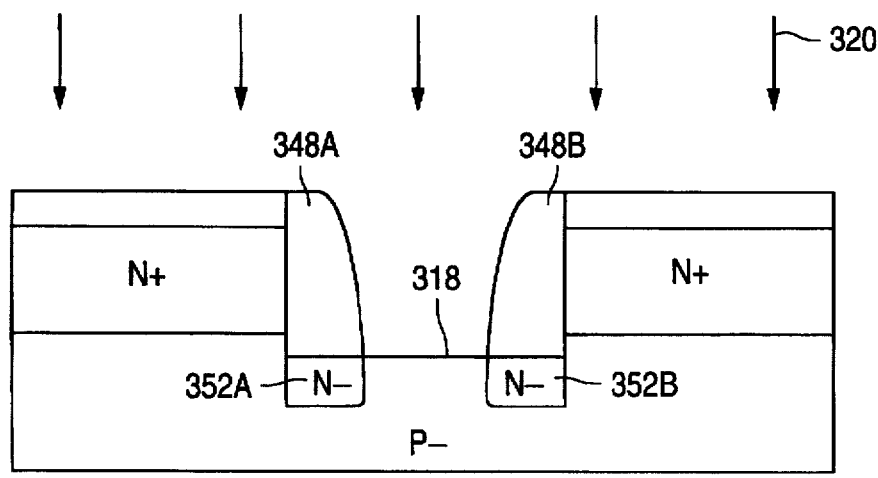
Figure 3H:
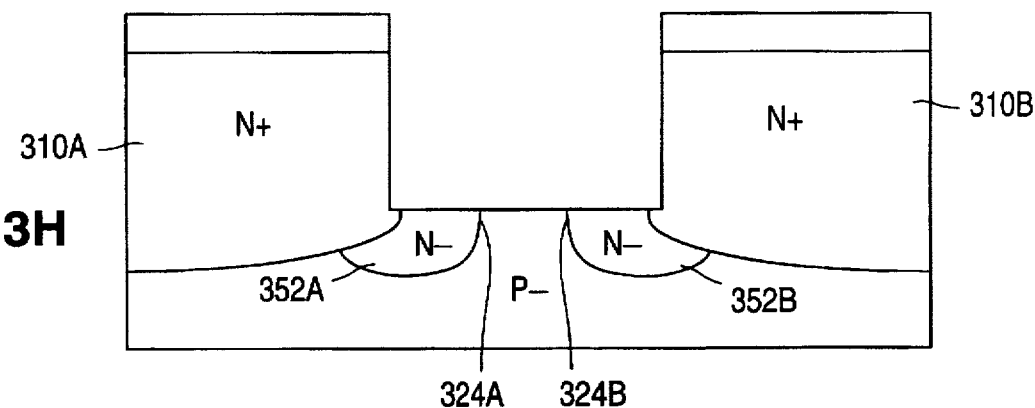

In FIG. 3G, a channel implant is provided by subjecting the structure to ion implantation of boron, as indicated by arrows 320. The channel implant differs from the channel implant in the first embodiment in several respects. First, the channel implant does not pass through all of bottom surface 318, instead, nitride spacers 348A and 348B provide an implant mask for the outer portions of bottom surface 318, and the channel implant passes through only the central portion of bottom surface 318. Second, the channel implant counterdopes doped layer 352 beneath the central portion of bottom surface 318, effectively splitting doped layer 352 into lighty doped source region 352A and lightly doped drain region 352B. Third, the boron dosage is about twice the boron dosage used in the first embodiment to assure adequate counterdoping of doped layer 352 beneath the central portion of bottom surface 318.

In FIG. 3X, nitride spacers 348A and 348B are stripped, and a rapid thermal anneal on the order of 950° to 1050° C. for 10 to 30 seconds is applied to remove crystalline damage and to activate and drive-in the implanted dopants. Since heavily doped and lightly doped source and drain regions 310A, 310B, 352A and 352B are doped solely by arsenic, very little diffusion occurs. However, source regions 310A and 352A merge to form a source, and drain regions 310B and 352B merge to form a drain. Furthermore, lightly doped source and drain regions 352A and 352B form channel junctions 324A and 324B, respectively, that are substantially aligned with the central portion of bottom surface 318.

Figure 3I:
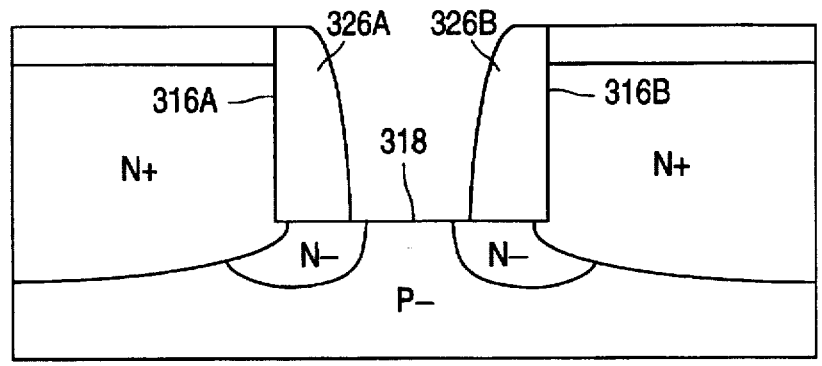

In FIG. 3I, a blanket layer of conductive metal is conformally deposited over substrate 302, and then an anisotropic etch is applied to form metal spacers 326A and 326B on sidewalls 316A and 316B, respectively, and on the outer portions of bottom surface 318. Metal spacers 326A and 326B leave exposed the central portion of bottom surface 318.

Figure 3J:
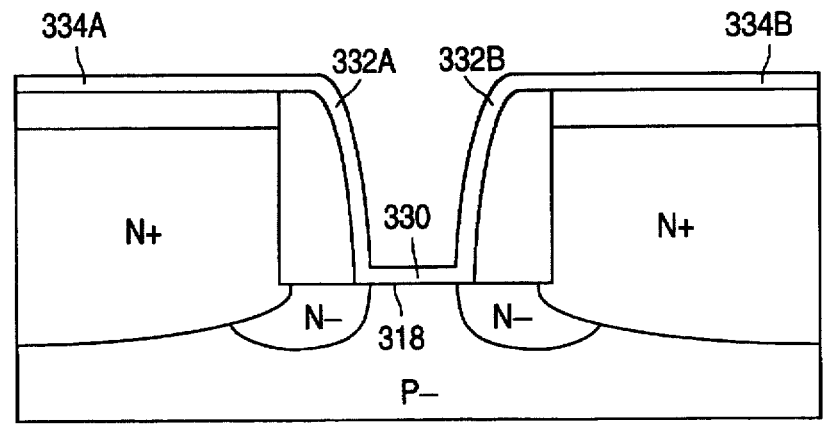

In FIG. 3J, an oxide layer is deposited over substrate 302 to form gate oxide 330 on the central portion of bottom surface 318, protective oxides 332A and 332B on metal spacers 326A and 326B, respectively, and oxide segments 334A and 334B on oxide layer regions 306A and 306B, respectively.

Figure 3K:
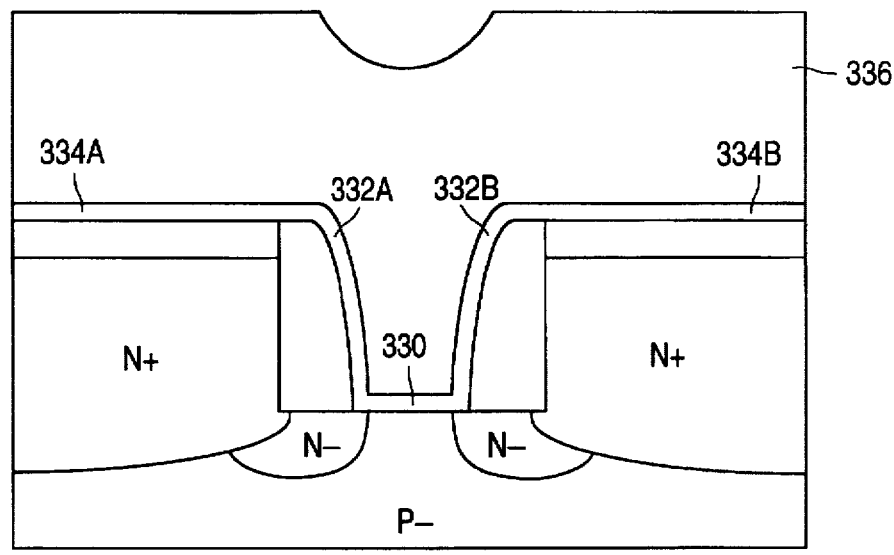

In FIG. 3K, a blanket layer of doped polysilicon 336 is deposited over substrate 302. Polysilicon 336 contacts gate oxide 330, protective oxides 332A and 332B, and oxide segments 334A and 334B and fills the remaining space in trench 314.

Figure 3L:
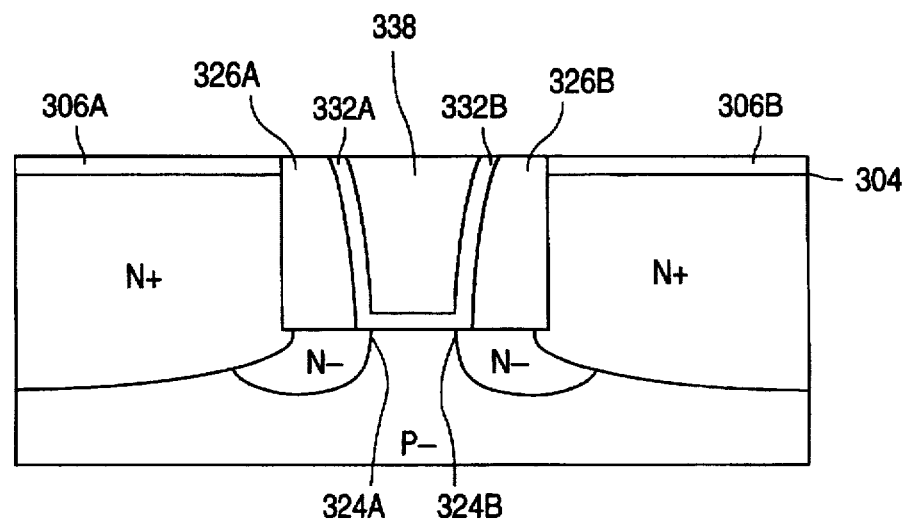

In FIG. 3L, the structure is planarized by applying chemical-mechanical polishing in the presence of an abrasive slurry. The polishing grinds down regions of polysilicon 326, but is discontinued before reaching top surface 304. The remaining portion of polysilicon 336 forms polysilicon gate electrode 338, which is aligned with metal spacers 326A and 326B, protective oxides 332A and 332B, and oxide layer regions 306A and 306B. Polysilicon gate electrode 338 is substantially aligned with top surface 304, and substantially all of polysilicon gate electrode 338 is within trench 314. Moreover, junctions 324A and 324B are substantially aligned with the bottom surface of polysilicon gate electrode 338.

Further processing steps in the fabrication of IGFETs typically include forming a thick oxide layer over the active regions, forming contact windows in the oxide layer above the source, drain and gate electrode, forming appropriate interconnect metallization in the contact windows, and then forming a passivation layer. In addition, either earlier or subsequent high-temperature process steps can be used to supplement or replace the drive-in step to provide the desired anneal, activation, and diffusion for the implanted dopants, although it is highly desirable to avoid melting the metal spacers since this may lead to metal spiking. These further processing steps are conventional and need not be repeated herein. Likewise the principal processing steps disclosed herein may be combined with other steps readily apparent to those skilled in the art.

At completion of the process, it is preferred that the channel length be precisely controlled. However, to the extent that the lateral locations of the channel junctions with the source and the drain are not (or can not be) precisely controlled, it is far preferable to have a slight overlap between the junctions and the gate electrode (where the gate electrode contacts the gate insulator) as opposed to a lateral displacement or gap. While a slight overlap leads to capacitive effects (known as "Miller capacitance") that tend to reduce switching speeds, a lateral displacement or gap may prevent formation of a conductive channel between the source and the drain during operation. Furthermore, decreasing the channel length increases the drive current. Therefore, the overlap between the gate electrode and the source and drain involves a tradeoff between switching speed and drive current.

The present invention includes numerous variations to the embodiments described above. For instance, various features of the above embodiments can be combined with others. The channel implant may not be essential and can provide enhancement-mode doping if desired. The source and drain can be spaced from the sidewalls, as long as they are adjacent to the bottom surface of the trench. Likewise, the metal spacers need not necessarily extend to the top surface of the substrate, as long as the gate electrode remains electrically isolated from the metal spacers and the substrate. The gate electrode can be patterned to extend beyond the trench length over the substrate. The disposable spacers, if any, need not have similar shapes or sizes as the metal spacers. The metal spacers can include several metal layers. For instance, a thin barrier metal such as titanium nitride can be deposited on the substrate, a thick metal layer can be deposited on the barrier metal, and then the anisotropic etch can be applied to form the metal spacers. The gate insulator, or a lower portion thereof, can be grown on the bottom surface between the disposable spacers. In this manner, the gate insulator can include a grown layer beneath a deposited layer. The gate insulator and protective insulators can be various dielectrics including oxides, nitrides, and oxynitrides. The N-type and P-type dopants can be reversed. Suitable P-type dopants include boron $B_{10}$, boron $B_{11}$, and $BF_x$ species such as $BF_2$.

Further details regarding trench transistors are disclosed in U.S. application Ser. No. 08/739,595 filed concurrently herewith, entitled "Trench Transistor With Insulative Spacers" by Gardner et al.; U.S. application Ser. No. 08/739,592, filed concurrently herewith, entitled "Trench Transistor With Localized Source/Drain Regions Implanted Through Voids In Trench" by Gardner et al.; U.S. application Ser. No 08/739/596 filed concurrently herewith, entitled "Trench Transistor With Localized Source/Drain Regions Implanted Through Selectively Grown Oxide Layer" by Gardner et al.; U.S. application Ser. No, 08/739,566 filed concurrently herewith, entitled "Trench Transistor In Combination With Trench Array" by Fulford, Jr. et al.; U.S. application Ser. No. 08/739,566 filed concurrently herewith, entitled "Trench Transistor And Isolation Trench" by Gardner et al.; and U.S. application Ser. No. 08/739,567 filed concurrently herewith, entitled "Trench Transistor With Source Contact In Trench" by Gardner et al.; the disclosures of which are incorporated herein by reference.

The invention is particularly well-suited for fabricating N-channel MOSFETs, P-channel MOSFETs, and other types of IGFETs, particularly for high-performance microprocessors where high circuit density is essential. Although only a single IGFET has been shown for purposes of illustration, it is understood that in actual practice, many devices are fabricated on a single semiconductor wafer as widely practiced in the art. Accordingly, the invention is well-suited for use in an integrated circuit chip, as well as an electronic system including a microprocessor, a memory, and a system bus.

Those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

What is claimed is:

1. A method of forming an IGFET with a gate electrode and metal spacers in a trench, comprising the steps of:

forming a trench with a bottom surface and opposing sidewalls in a substrate;

forming a source and a drain in the substrate and adjacent to the bottom surface;

forming metal spacers in the trench and adjacent to the sidewalls and outer portions of the bottom surface and outside a central portion of the bottom surface after forming the source and the drain;

forming a gate insulator on the central portion of the bottom surface;

forming protective insulators on the metal spacers; and forming a gate electrode on the gate insulator and the protective insulators such that the gate electrode is spaced from and electrically isolated from the metal spacers and the substrate.

2. The method of claim 1, wherein the gate insulator and the protective insulators are formed simultaneously.

3. The method of claim 1, wherein at least a portion of the gate insulator is formed before forming the metal spacers.

4. The method of claim 3, wherein forming the at least portion of the gate insulator includes forming disposable spacers in the trench, growing an oxide layer on the bottom surface between the disposable spacers, and then removing the disposable spacers before forming the metal spacers.

5. The method of claim 1, wherein forming the source and the drain includes applying a high-temperature anneal.

6. The method of claim 5, wherein forming the source and the drain includes implanting a doped layer into the substrate before forming the trench, and applying the high-temperature anneal after forming the trench.

7. The method of claim 6, wherein forming the trench includes etching completely through the doped layer, thereby splitting the doped layer into source and drain regions.

8. The method of claim 7, wherein the source and drain regions provide all doping for the source and drain, and applying the high-temperature anneal causes the source and drain regions to diffuse beneath the bottom surface.

9. The method of claim 7, wherein forming the source and the drain includes implanting a second doped layer through the bottom surface of the trench, forming disposable spacers in the trench, counterdoping a region of the second doped layer using the disposable spacers as an implant mask, thereby splitting the second doped layer into second source and drain regions, removing the disposable spacers, and applying the high-temperature anneal so that the source region and second source region merge to provide the source, and the drain region and second drain region merge to provide the drain.

10. The method of claim 5, wherein forming the trench includes etching partially through the doped layer.

11. The method of claim 10, wherein forming the source and the drain includes forming disposable spacers in the trench, counterdoping a region of the doped layer beneath the bottom surface using the disposable spacers as an implant mask, thereby splitting the doped layer into source and drain regions, and removing the disposable spacers.

12. The method of claim 1, wherein the metal spacers contact lightly doped regions of the source and the drain at the bottom surface, and contact heavily doped regions of the source and the drain at the sidewalls.

13. The method of claim 1, wherein forming the trench includes patterning a photoresist layer over the substrate, and applying an anisotropic etch through an opening in the photoresist layer.

14. The method of claim 13, wherein a length between the sidewalls corresponds to a length of the opening, and a length of a channel between the source and the drain and adjacent to the bottom surface is less than half of the length between the sidewalls.

15. The method of claim 14, wherein the length of the opening represents a minimum resolution of a lithographic system used to define the opening.

16. The method of claim 1, wherein forming the metal spacers includes depositing a blanket layer of conductive metal over the substrate and into the trench, and then applying an anisotropic etch.

17. The method of claim 1, wherein forming the metal spacers includes depositing a blanket layer of a first conductive metal over the substrate and into the trench, depositing a second blanket layer of a second conductive metal on the first conductive metal, and then applying an anisotropic etch.

18. The method of claim 1, wherein the metal spacers are selected from the group consisting of aluminum, tungsten, titanium, cobalt, and combinations thereof.

19. The method of claim 1, wherein forming the gate electrode includes depositing a blanket layer of gate electrode material over the substrate and into the trench, and then polishing the gate electrode material until the gate electrode is substantially aligned with a top surface of the substrate and no portion of the gate electrode overlaps the top surface.

20. The method of claim 1, wherein substantially all of the gate electrode is within the trench.

21. The method of claim 1, wherein the gate electrode is polysilicon, and the gate insulator and protective insulators are a continuous insulative layer selected from the group consisting of silicon dioxide, silicon nitride and silicon oxynitride.

22. The method of claim 1, wherein the IGFET is an N-channel MOSFET.

23. The method of claim 1, wherein the IGFET is a P-channel MOSFET.

24. A method of forming an IGFET with a gate electrode and metal spacers in a trench, comprising the steps of:

providing a semiconductor substrate;

providing a photoresist layer with an opening over the substrate;

applying an anisotropic etch through the opening in the photoresist layer to form a trench partially through the substrate, wherein the trench extends to a top surface of the substrate and has opposing sidewalls and a bottom surface;

forming a source and a drain in the substrate, including applying a high-temperature anneal, wherein the source and the drain are adjacent to the top surface, the sidewalls, and outer portions of the bottom surface, and the source and the drain provide channel junctions for a channel adjacent to a central portion of the bottom surface;

depositing a conductive metal over the substrate after forming the source and the drain, and applying an anisotropic etch to the conductive metal to form metal spacers in the trench adjacent to the sidewalls and the outer portions of the bottom surface, wherein the metal spacers contact the source and the drain at the sidewalls and the outer portions of the bottom surface;

depositing a continuous insulative layer to form a gate insulator on the central portion of the bottom surface between the metal spacers and form protective insulators on sides of the metal spacers opposite the sidewalls; and depositing a gate electrode material over the substrate and then polishing the gate electrode material to form a gate electrode in the trench on the gate insulator and the protective insulators, wherein the gate electrode is spaced from and electrically isolated from the metal spacers and the substrate.

25. The method of claim 24, wherein forming the source and the drain includes:

implanting a doped layer into the substrate before forming the trench;

forming the trench completely through the doped layer, thereby splitting the doped layer into source and drain regions that are adjacent to the sidewalls and spaced from the bottom surface; and applying the high-temperature anneal to activate the source and the drain regions and to diffuse the source and drain regions beneath the bottom surface to provide the channel junctions.

26. The method of claim 24, wherein forming the source and the drain includes:

implanting a doped layer into the substrate before forming the trench;

forming the trench partially through the doped layer such that the doped layer is adjacent to the bottom surface;

forming disposable spacers in the trench;

counterdoping a region of the doped layer beneath the bottom surface using the disposable spacers as an implant mask, thereby splitting the doped layer source and drain regions;

removing the disposable spacers; and applying the high-temperature anneal to activate the source and drain regions, wherein the source and drain regions provide the channel junctions.

27. The method of claim 26, wherein:

the doped layer includes a heavily doped upper layer adjacent to the top surface and spaced from the bottom surface, and includes a lightly doped lower layer adjacent to the bottom surface and spaced from the top surface; and the trench is formed completely through the doped upper layer and partially through the doped lower layer.

28. The method of claim 24, wherein forming the source and the drain includes:

implanting a doped layer into the substrate before forming the trench;

forming the trench completely through the doped layer, thereby splitting the doped layer into first source and drain regions that are adjacent to the sidewalls and spaced from the bottom surface;

implanting a second doped layer through the bottom surface;

forming disposable spacers in the trench;

counterdoping a region of the second doped layer beneath the bottom surface using the disposable spacers as an implant mask, thereby splitting the second doped layer into second source and drain regions;

removing the disposable spacers; and applying the high-temperature anneal to activate the first and second source and drain regions, to merge the first and second source regions, and to merge the first and second drain regions, wherein the second source and drain regions provide the channel junctions.

29. The method of claim 1, wherein the source and the drain contact the metal spacers at the sidewalls and at the bottom surface.

30. The method of claim 1, wherein the source and drain include lightly doped source and drain regions adjacent to the bottom surface and displaced from a top surface of the substrate, and the source and drain include heavily doped source and drain regions adjacent to the top surface and displaced from the bottom surface.

31. The method of claim 1, wherein the source and the drain form channel junctions substantially aligned with a bottom surface of the gate electrode.

32. The method of claim 1, wherein a length of a channel between the source and the drain is less than half of a length between the sidewalls.

33. The method of claim 1, wherein forming the source and the drain includes providing at least some doping for the source and drain before forming the trench.

34. The method of claim 1, wherein forming the source and the drain includes providing all doping for the source and the drain and driving-in the source and the drain before forming the metal spacers.

35. The method of claim 1, wherein the gate electrode has a planar top surface.

36. The method of claim 1, wherein forming the gate electrode includes:

depositing a blanket layer of gate electrode material over the substrate and into the trench, thereby filling any remaining space in the trench; and polishing the gate electrode material to form the gate electrode with a planar top surface.

37. At The method of claim 1, wherein the metal spacers are substantially aligned with a top surface of the substrate.

38. The method of claim 1, wherein the metal spacers extend above a top surface of the substrate.

39. The method of claim 1, including forming the gate insulator after forming the metal spacers.

40. The method of claim 1, including forming the gate insulator and the protective insulators by depositing a layer of silicon dioxide at a temperature below the melting points of the metal spacers.

41. The method of claim 1, wherein the gate electrode is a non-floating gate electrode.

42. The method of claim 1, wherein the gate electrode is substantially aligned with a top surface of the substrate.

43. The method of claim 1, wherein a majority of a thickness of the gate electrode is in the trench.

44. The method of claim 1, wherein a majority of a thickness of the metal spacers is in the trench.

45. The method of claim 1, wherein a majority of a thickness of the gate electrode and the metal spacers is in the trench, and the gate electrode and the metal spacers have essentially identical thicknesses.

46. The method of claim 45, wherein essentially all of the thickness of the gate electrode and the metal spacers is in the trench.

47. The method of claim 45, wherein the gate electrode is a non-floating gate electrode.

48. The method of claim 45, wherein the gate electrode has a planar top surface.

49. The method of claim 45, wherein the source and the drain contact the metal spacers at the sidewalls and the bottom surface.

50. The method of claim 45, wherein essentially all of the thickness of the gate electrode and the metal spacers is in the trench, the gate electrode is a non-floating gate electrode with a planar top surface, and the source and the drain contact the metal spacers at the sidewalls and the bottom surface.

* * * * *

UNITED STATES PATENT AND TRADEMARK OFFICE
CERTIFICATE OF CORRECTION

PATENT NO.    : 5,801,075
ISSUE DATE    : September 1, 1998
INVENTOR(S)   : Gardner, Mark I. et al It is certified that error appears in the above-identified patent and that said Letters Patent is hereby corrected as shown below:

Column 12, line 48; please delete "08/739,566" and insert --08/739,597--

Signed and Sealed this

Seventh Day of September, 1999

Attest:

Q. TODD DICKINSON

Attesting Officer     Acting Commissioner of Patents and Trademarks